United States Patent
Sawabe et al.

(10) Patent No.: US 9,353,458 B2
(45) Date of Patent: May 31, 2016

(54) BASE SUBSTRATE FOR EPITAXIAL DIAMOND FILM, METHOD FOR PRODUCING THE BASE SUBSTRATE FOR EPITAXIAL DIAMOND FILM, EPITAXIAL DIAMOND FILM PRODUCED WITH THE BASE SUBSTRATE FOR EPITAXIAL DIAMOND FILM, AND METHOD FOR PRODUCING THE EPITAXIAL DIAMOND FILM

(75) Inventors: Atsuhito Sawabe, Yokosuka (JP); Hitoshi Noguchi, Annaka (JP); Shintaro Maeda, Sagamihara (JP)

(73) Assignee: ATSUHITO SAWABE, Kanagawa (JP)

( * ) Notice: Subject to any disclaimer, the term of this patent is extended or adjusted under 35 U.S.C. 154(b) by 1236 days.

(21) Appl. No.: 12/225,570

(22) PCT Filed: Feb. 5, 2007

(86) PCT No.: PCT/JP2007/051915
§ 371 (c)(1),
(2), (4) Date: Sep. 24, 2008

(87) PCT Pub. No.: WO2007/116600
PCT Pub. Date: Oct. 18, 2007

(65) Prior Publication Data
US 2009/0176114 A1 Jul. 9, 2009

(30) Foreign Application Priority Data
Mar. 31, 2006 (JP) ................................. 2006-097697

(51) Int. Cl.
*C30B 23/02* (2006.01)
*C30B 25/10* (2006.01)
(Continued)

(52) U.S. Cl.
CPC ............... *C30B 23/02* (2013.01); *C23C 16/272* (2013.01); *C30B 25/105* (2013.01); *C30B 25/18* (2013.01);
(Continued)

(58) Field of Classification Search
None
See application file for complete search history.

(56) References Cited

U.S. PATENT DOCUMENTS 7,514,146 B2 * 4/2009 Noguchi et al. ............. 428/408
2004/0069209 A1 * 4/2004 Golding et al. ................ 117/2
(Continued)

FOREIGN PATENT DOCUMENTS

JP 2006-248883 9/2006

OTHER PUBLICATIONS

Ando et al., "Patterned growth of heteroepitaxial diamond", Diamond and Related Materials, 13, (2004) 1975-1979.*
(Continued)

*Primary Examiner* — Guinever S Gregorio
(74) *Attorney, Agent, or Firm* — DLA Piper LLP (US)

(57) ABSTRACT

The present invention provides a base substrate for epitaxial diamond film capable of epitaxially growing a large area of high quality diamond, having a diameter of 1 inch (2.5 cm) or more, on an iridium base by using the CVD method, a method for producing the base substrate for epitaxial diamond film, an epitaxial diamond film produced with the base substrate for epitaxial diamond film and a method for producing the epitaxial diamond film. An iridium (Ir) film is formed by epitaxial growth on a single crystal magnesium oxide (MgO) substrate or a single crystal sapphire ($\alpha$-$Al_2O_3$) substrate by means of a vacuum deposition method or a sputtering method, and a bias nucleus generation process of forming epitaxial diamond nuclei is applied to the surface of the iridium (Ir) base formed as a film by exposing an ion-containing direct current plasma to the surface of the iridium (Ir) base formed as a film.

8 Claims, 6 Drawing Sheets

(51) Int. Cl.
*C30B 25/18* (2006.01)
*C30B 29/02* (2006.01)
*C30B 29/04* (2006.01)
*H01L 21/02* (2006.01)
*C23C 16/27* (2006.01)
*H01J 37/32* (2006.01)
*H01J 37/34* (2006.01)

(52) U.S. Cl.
CPC ............... *C30B 29/02* (2013.01); *C30B 29/04* (2013.01); *H01J 37/32009* (2013.01); *H01J 37/34* (2013.01); *H01J 37/3447* (2013.01); *H01L 21/0242* (2013.01); *H01L 21/0262* (2013.01); *H01L 21/02433* (2013.01); *H01L 21/02491* (2013.01); *H01L 21/02516* (2013.01); *H01L 21/02527* (2013.01)

(56) References Cited

U.S. PATENT DOCUMENTS

| | | | | |
|---|---|---|---|---|
| 2007/0075427 | A1* | 4/2007 | Lavoie et al. | 257/750 |
| 2007/0209578 | A1* | 9/2007 | Noguchi | C30B 25/18 117/94 |
| 2008/0003447 | A1* | 1/2008 | Nee | C30B 25/00 428/615 |
| 2009/0004093 | A1* | 1/2009 | Nee | C01B 31/06 423/446 |
| 2010/0175613 | A1* | 7/2010 | Noguchi | C30B 25/18 117/101 |
| 2010/0178234 | A1* | 7/2010 | Noguchi | C30B 25/105 423/446 |
| 2010/0294196 | A1* | 11/2010 | Noguchi | C30B 25/186 117/103 |
| 2011/0081531 | A1* | 4/2011 | Noguchi | C30B 25/183 428/213 |
| 2011/0084285 | A1* | 4/2011 | Noguchi | C30B 25/06 257/77 |
| 2011/0315074 | A1* | 12/2011 | Noguchi | C30B 25/183 117/95 |
| 2014/0041574 | A1* | 2/2014 | Noguchi | C30B 25/16 117/103 |
| 2015/0075420 | A1* | 3/2015 | Noguchi | C30B 25/105 117/86 |

OTHER PUBLICATIONS

S. Koizumi et al., Epitaxial growth of diamond thin films on cubic boron nitoride surfaces . . . , 1990, pp. 563-565, American Institute of Physics.

S. Yugo et al., Generation of diamond nuclei by electric field in plasma chemical vapor deposition, 1991, pp. 1036-1036, American Institute of Physics.

B.R. Stoner et al., Textured diamond growth . . . , 1992, pp. 698-700, American Institute of Physics.

P.C. Yang et al., Nucleation of oriented diamond films on nickel substrate, 1993, pp. 1773-1776, Materials Research Society.

Takeshi Tachibana et.al., Heteroepitaxial diamond growth process on platinum, 1997, pp. 266-271, Elsevier Science S.A.

Kazuki Ohtsuka et al., Epitaxial growth of diamond on iridium, 1996, pp. 1072-1074, Japan Society of Applied Physics.

H. Okamura et al., Diamond growth on ion irradiated iridium substrate . . . , 2002, pp. 54-55, 16th Diamond Symposium Koen.

Takeshi Tachibana et al., Growth oriented diamond on pt/ir/pt substrate deposited on sapphire, 2001, pp. 1633-1636, Elsevier Science B.V.

Y. Ando et al., Patterned growth of heteroepitaxial diamond, 2004, pp. 1975-1979, Elsevier Science B.V.

Y. Ando et al., Diamond heteroepitaxial growth under controlled a-parameters by . . . , 2003, pp. 44-45, New Diamond Forum.

* cited by examiner

H2,CH4

BASE SUBSTRATE FOR EPITAXIAL DIAMOND FILM, METHOD FOR PRODUCING THE BASE SUBSTRATE FOR EPITAXIAL DIAMOND FILM, EPITAXIAL DIAMOND FILM PRODUCED WITH THE BASE SUBSTRATE FOR EPITAXIAL DIAMOND FILM, AND METHOD FOR PRODUCING THE EPITAXIAL DIAMOND FILM

TECHNICAL FIELD

The present invention relates to a production of a free-standing epitaxial diamond film applicable to various electronic devices, in particular, a base substrate for epitaxial diamond film for synthesizing a high quality and large area epitaxial diamond film, a method for producing the base substrate for epitaxial diamond film, an epitaxial diamond film produced with the base substrate for epitaxial diamond film and a method for producing the epitaxial diamond film.

BACKGROUND TECHNOLOGY

Diamond is a material having excellent properties as a semiconductor. Additionally, diamond is expected to be applied to electronic devices unfeasible with existing semiconductor materials. Examples of such electronic devices include high frequency devices, power devices and ultraviolet light emitting devices. Further, diamond is a material having a negative electron affinity (NEA), and hence is expected to be applied to electron emitting devices to operate at low voltages.

However, when diamond is applied as electronic devices, defects contained in the crystal affects the properties of the devices, and hence there is needed a diamond that contains as few crystal defects as possible and has a crystallinity close to the crystallinity of a single crystal. Further, for the purpose of industrialization of electronic devices using diamond, it is essential to place the production of diamond into the production line of a factory. Therefore, needed is a technique for synthesizing a high quality and large area diamond film.

In this connection, as a general synthesis method of diamond, known is a high pressure high temperature (HPHT) synthesis method; according to this method, a high quality diamond smaller in the content of crystal defects than natural diamond can be synthesized depending on the conditions. The size of the largest hitherto reported diamond based on the HPHT method is approximately 10×10 mm. As another method for synthesizing diamond, there is a chemical vapor deposition (CVD) method. This synthesis method is a film formation method in which an introduced source gas is decomposed by means of a method of some kind and thus, a desired material is deposited on a substrate. Therefore, according to this synthesis method, the size of the substrate is not limited in principle, and hence this method can be expected to be applied as a method for forming a diamond film on a large area substrate. For example, either the microwave plasma CVD method or the direct current plasma CVD method is considered to be capable of forming a film of polycrystalline diamond on a substrate of 4 inches (approximately 10 cm) or more in diameter.

Additionally, for the purpose of obtaining a large size single crystal diamond, an attempt has been made in which diamond is epitaxially grown on a foreign substrate. Examples of the substrate materials for which epitaxial diamond growth has hitherto been identified include, cubic boron nitride (c-BN) [see Non-patent Document 1], nickel (Ni), silicon (Si) [see Non-patent Document 3], zinc-blende type silicon carbide (β-SiC) [see Non-patent Document 4], cobalt (Co), platinum (Pt) [see Non-patent Document 5] and iridium (Ir). Among these, only iridium enables synthesis of a large area single crystal and growth of a high quality diamond which does not include carbon components other than diamond and does not include non-epitaxial diamond particles involving rotation or inclination. Accordingly, use of iridium for an underlayer of epitaxial diamond may offer a possibility of obtaining a large area, high quality diamond.

For the purpose of obtaining a large area diamond through hetero-epitaxial growth, it is essential to prepare a base material so as to have a large area. Iridium permits preparing an epitaxial thin film by sputtering or vacuum deposition. However, important is an investigation of base materials for use in growth of iridium for a large area formation. For the substrate for growth of iridium, magnesium oxide (MgO), $SrTiO_3$ (STO) and sapphire ($\alpha$-$Al_2O_3$) have hitherto been used.

For growth of epitaxial diamond on iridium, known is the pretreatment of the base surface for the purpose of bias enhanced nucleation [see Non-patent Document 2]. In other words, in the bias enhanced nucleation, by exposing an ion-containing plasma to the iridium base surface, epitaxial diamond nuclei are formed. Successive application of the CVD method to a long time diamond growth enables a preparation of a free-standing epitaxial diamond film. Examples of the bias enhanced nucleation apparatus usable for applying such a pretreatment as described above include a microwave plasma CVD apparatus, a three electrode direct current plasma CVD apparatus [see Non-patent Document 6] and a parallel plate electrode type direct current plasma generator.

The parallel plate electrode type direct current plasma generator is an apparatus developed for solving a problem associated with the diamond nucleation on an iridium base with the three electrode direct current plasma CVD apparatus. The problem concerned is such that the nuclei are generated non-uniformly, and accordingly, the diamond formed on the substrate is divided into an epitaxial growth area, a non-epitaxial growth area and a non-growth area. The anode of the three electrode direct current plasma CVD apparatus is of a ring shape, and this shape is probably the cause for the non-uniform nucleation. Accordingly, in the parallel plate electrode type direct current plasma generator, adoption of a flat plate anode has enabled an extension of the epitaxial growth area of diamond over the whole surface of, for example, an 10×10 mm iridium base.

However, adoption of such a large area of iridium base in such a parallel plate electrode type direct current plasma generator necessitates a size and shape change of the cathode; thus, essential is a development of an appropriate anode diameter and the separation between the anode and the substrate (hereinafter, these are collectively referred to as the electrode layout) to be compatible with such a change as described above. Additionally, a large area iridium base may be coped with discharge current increase with a fixed current density; however, such a discharge current increase is anticipated to cause an increase of the heat amount generated in the substrate and an increase of the substrate temperature. In this connection, the substrate temperature at the time of the bias enhanced nucleation is a parameter to give a remarkable change to the number density of diamond particles, and hence there are various subjects to be developed such as the substrate temperature required to be controlled independently of the discharge current.

Non-patent Document 1: S. Koizumi, T. Murakami, K. Suzuki and T. Inuzuka, Appl. Phys. Lett., Vol. 57, No. 6, pp. 563-565 (1990)

Non-patent Document 2: S. Yugo, T. Kanai, T. Kimura and T. Muto, Appl. Phys. Lett., Vol. 58, No. 10, pp. 1036-1038 (1991)

Non-patent Document 3: B. R. Stoner and J. T. Glass, Appl. Phys. Lett., Vol. 60, No. 6, PP. 698-700 (1992)

Non-patent Document 4: P. C. Yang, W. Zhu and J. T. Glass, J. Mater. Res., Vol. 8, No. 8, pp. 1773-1776 (1993)

Non-patent Document 5: T. Tachibana, Y. Yokota, K. Miyata, K. Kobashi and Y. Shintani, Diamond and Related Materials, Vol. 6, Nos. 2-4, pp. 266-271 (1997)

Non-patent Document 6: K. Ohtsuka, K. Suzuki, A. Sawabe and T. Inuzuka, Jpn. J. Appl. Phys., Vol. 35, No. 8B, pp. L1072-1074 (1996)

DISCLOSURE OF INVENTION

Problems the Invention Resolves

Thus, an object of the present invention is to provide a base substrate for epitaxial diamond film capable of epitaxially growing a large area of high quality diamond, having a diameter of 1 inch (2.5 cm) or more, on an iridium base by using the CVD method, a method for producing the base substrate for epitaxial diamond film, an epitaxial diamond film produced with the base substrate for epitaxial diamond film and a method for producing the epitaxial diamond film.

Means for Resolving the Problems

For the purpose of achieving the above-described object, the present invention includes the following aspects.

A first aspect of the present invention is a method for producing a base substrate for epitaxial diamond film, characterized by including: forming an iridium (Ir) film by epitaxial growth on a single crystal magnesium oxide (MgO) substrate or a single crystal sapphire ($\alpha$-$Al_2O_3$) substrate by means of a vacuum deposition method or a sputtering method; and applying to the surface of the iridium (Ir) base formed as a film a bias enhanced nucleation process of forming epitaxial diamond nuclei by exposing an ion-containing direct current plasma to the surface of the iridium (Ir) base formed as a film.

A second aspect of the present invention is the method for producing a base substrate for epitaxial diamond film, characterized in that: the single crystal magnesium oxide (MgO) substrate on which the iridium (Ir) film is epitaxially grown by means of the vacuum deposition method or the sputtering method is made to have a plane direction of {100} for the surface thereof on which the iridium (Ir) film is formed and have a polished surface as the surface thereof on which the iridium (Ir) film is formed.

A third aspect of the present invention is the method for producing a base substrate for epitaxial diamond film according to the first aspect, characterized in that: the single crystal sapphire ($\alpha$-$Al_2O_3$) substrate on which the iridium (Ir) film is epitaxially grown by means of the vacuum deposition method or the sputtering method is made to have a plane direction of {0001} for the surface thereof on which the iridium (Ir) film is formed and have a polished surface as the surface thereof on which the iridium (Ir) film is formed.

A fourth aspect of the present invention is the method for producing a base substrate for epitaxial diamond film according to the first aspect, characterized in that: the bias enhanced nucleation process is conducted with a direct current plasma under the conditions that a parallel plate electrode type direct current plasma generator is used, the diameter of the anode is set at 7 to 25 mm, the separation between the anode and the substrate is set at 5 to 11 mm, a discharge gas composed of $H_2$ and $CH_4$ is used, the concentration of $CH_4$ is set at 2 to 5%, the discharge gas pressure is set at 80 to 150 Torr, the discharge current density is set at 150 to 250 mA/cm$^2$, the discharge voltage is set at 250 to 760 V, the substrate temperature is set at 800 to 1100° C. and the discharge time is set at 30 to 120 seconds.

A fifth aspect of the present invention is a base substrate for epitaxial diamond film, characterized in that: the base substrate includes a single crystal magnesium oxide (MgO) substrate on the surface of which an iridium (Ir) film is formed by epitaxial growth by means of a sputtering method; and the surface of the iridium (Ir) base formed as a film on the substrate is subjected to a bias enhanced nucleation process for forming epitaxial diamond nuclei by exposing an ion-containing plasma to the surface of the iridium (Ir) base formed as a film by using a parallel plate electrode type direct current plasma generator.

A sixth aspect of the present invention is a base substrate for epitaxial diamond film, characterized in that: the base substrate includes a single crystal sapphire ($\alpha$-$Al_2O_3$) substrate on the surface of which an iridium (Ir) film is formed by epitaxial growth by means of a sputtering method; and the surface of the iridium (Ir) base formed as a film on the substrate is subjected to a bias enhanced nucleation process for forming epitaxial diamond nuclei by exposing an ion-containing plasma to the surface of the iridium (Ir) base formed as a film by using a parallel plate electrode type direct current plasma generator.

A seventh aspect of the present invention is a method for producing an epitaxial diamond film, characterized by including: forming an iridium (Ir) film on a single crystal magnesium oxide (MgO) substrate by epitaxial growth by means of a sputtering method; forming a base substrate for epitaxial diamond film by applying to the surface of the iridium (Ir) base formed as a film a bias enhanced nucleation process of forming epitaxial diamond nuclei by exposing an ion-containing plasma to the surface of the iridium (Ir) base formed as a film by using a parallel plate electrode type direct current plasma generator; and obtaining a free-standing epitaxial diamond film on the base substrate for epitaxial diamond film by using a multiple electrode type direct current plasma CVD apparatus.

An eighth aspect of the present invention is a method for producing an epitaxial diamond film, characterized by including: forming an iridium (Ir) film on a single crystal sapphire ($\alpha$-$Al_2O_3$) substrate by epitaxial growth by means of a sputtering method; forming a base substrate for epitaxial diamond film by applying to the surface of the iridium (Ir) base formed as a film a bias enhanced nucleation process of forming epitaxial diamond nuclei by exposing an ion-containing plasma to the surface of the iridium (Ir) base formed as a film by using a parallel plate electrode type direct current plasma generator; and obtaining a free-standing epitaxial diamond film on the base substrate for epitaxial diamond film by using a multiple electrode type direct current plasma CVD apparatus.

A ninth aspect of the present invention is the method for producing an epitaxial diamond film, characterized in that the base substrate for epitaxial diamond film is produced by the method for producing a base substrate for epitaxial diamond film according to the second or fourth aspect.

A tenth aspect of the present invention is the method for producing an epitaxial diamond film, characterized in that the base substrate for epitaxial diamond film is produced by the method for producing a base substrate for epitaxial diamond film according to the third or fourth aspect.

An eleventh aspect of the present invention is an epitaxial diamond film, characterized in that: a base substrate for epitaxial diamond film is used wherein the base substrate is obtained by exposing an ion-containing plasma, by using a parallel plate electrode type direct current plasma generator, and thus applying a bias enhanced nucleation process for forming epitaxial diamond nuclei to the surface of the iridium (Ir) base of a single crystal magnesium oxide (MgO) substrate on the surface of which an iridium (Ir) film is formed by epitaxial growth by means of a sputtering method; and a free-standing epitaxial diamond film is obtained on the surface, subjected to the bias enhanced nucleation process, of the base substrate for epitaxial diamond film by using a multiple electrode type direct current plasma CVD apparatus.

A twelfth aspect of the present invention is an epitaxial diamond film, characterized in that: a base substrate for epitaxial diamond film is used wherein the base substrate is obtained by exposing an ion-containing plasma, by using a parallel plate electrode type direct current plasma generator, and thus applying a bias enhanced nucleation process for forming epitaxial diamond nuclei to the surface of the iridium (Ir) base of a single crystal sapphire ($\alpha$-$Al_2O_3$) substrate on the surface of which an iridium (Ir) film is formed by epitaxial growth by means of a sputtering method; and a free-standing epitaxial diamond film is obtained on the surface, subjected to the bias enhanced nucleation process, of the base substrate for epitaxial diamond film by using a multiple electrode type direct current plasma CVD apparatus.

Benefits of Invention

The method for producing a base substrate for epitaxial diamond film, according to the first aspect of the present invention, enables easy production of a base substrate for epitaxial diamond film, capable of uniformly and highly densely generating epitaxial diamond nuclei.

The method for producing a base substrate for epitaxial diamond film, according to any one of the second, third and fourth aspects of the present invention, enables easy production of a base substrate for epitaxial diamond film, capable of realizing a large area base substrate for epitaxial diamond film.

The base substrate for epitaxial diamond film, according to either one of the fifth and sixth aspects of the present invention, enables uniform and highly dense generation of epitaxial diamond nuclei, and also easily enables production of a large area epitaxial diamond film.

The method for producing an epitaxial diamond film, according to any one of the seventh, eighth, ninth and tenth aspects of the present invention, enables uniform and highly dense generation of epitaxial diamond nuclei, and also easily enables production of a large area epitaxial diamond film.

The epitaxial diamond film, according to either one of the eleventh and twelfth aspects of the present invention, enables uniform and highly dense generation of epitaxial diamond nuclei, and also enables easy obtainment of a large area free-standing epitaxial diamond film.

BEST MODE FOR CARRYING OUT THE INVENTION

Hereinafter, the best mode for carrying out a base substrate for epitaxial diamond film, a method for producing the base substrate for epitaxial diamond film, an epitaxial diamond film produced with the base substrate for epitaxial diamond film and a method for producing the epitaxial diamond film, according to the present invention, will be described in detail with reference to the accompanying drawings.

First, the base substrate for epitaxial diamond film and the method for producing an epitaxial diamond film by using the base substrate for epitaxial diamond film, of the present invention, fundamentally include the steps shown in FIG. 1. Specifically, in FIG. 1, the base substrate for epitaxial diamond film of the present invention is produced by a step (I) of forming an epitaxial Ir thin film in which an iridium (Ir) thin film is formed on a single crystal magnesium oxide (MgO) substrate by epitaxial growth by using a high frequency sputtering method, and by a step (II) of a bias enhanced nucleation process in which epitaxial diamond nuclei are formed by exposing an ion-containing plasma to the surface of the iridium (Ir) base formed as a film by using a parallel plate electrode type direct current plasma generator. Additionally, the epitaxial diamond film using the base substrate for epitaxial diamond film is produced by a step (III) of growing epitaxial diamond in which epitaxial diamond is grown on the surface, subjected to the bias enhanced nucleation process, of the base substrate for epitaxial diamond film by using a multiple electrode type direct current plasma CVD apparatus.

(Production of an Epitaxial Ir Thin Film)

FIG. 2 is a schematic view of the configuration illustrating an embodiment of a high frequency sputtering apparatus for forming an epitaxial Ir thin film for producing the base substrate for epitaxial diamond film according to the present invention.

Specifically, in the high frequency sputtering apparatus 10 shown in FIG. 2, an evacuation system 11 is made up of a rotary pump and a turbo molecular pump, and can attain a vacuum evacuation of the order of $10^{-8}$ Torr. Argon (Ar) is used as the discharge gas at the time of sputtering, and the configuration is formed in such a way that a mass flow controller 12 can regulate the flow rate. The pressures at the times of preliminary evacuation and sputtering film formation are measured with an ionization vacuum gauge. A high frequency power source 13 can be connected to any of a target 14 and a substrate heater 15. For the target 14, an iridium Ir disc of 5 cm in diameter and 99.95% or more in purity is used. A shutter 16 is disposed immediately below the target 14, for the purpose of preventing flying of iridium Ir toward the substrate at the time of presputtering. The substrate heater 15 is connected to a direct current power source 17, and has a highest heating temperature of 1000° C. and a size of 5 cm in diameter. Additionally, the target 14 is located approximately 8 cm above the substrate heater 15. For the purpose of preventing the deposition of iridium Ir on metal wiring at the time of film formation, a protecting plate 19 is disposed through the intermediary of an insulating plate 18.

Next, the production of the epitaxial Ir thin film according to the present invention is described by using the high frequency sputtering apparatus having such a configuration as described above.

A single crystal {100} magnesium oxide (MgO) is used as a substrate 20, the size of the substrate 20 is 1 inch (2.5 cm) in diameter, the thickness of the substrate 20 is 1 mm, and polishing is made with a one-side polishing and the epitaxial Ir film is formed on the polished surface. After the substrate 20 has been placed, the interior of a vacuum chamber is evacuated to $3\times10^{-7}$ Torr or less. The substrate 20 is heated to 680° C. to remove the adsorbed gas or the like attached to the substrate surface. Then, Ar is introduced at 5 sccm, and then the pressure is regulated to $1.5\times10^{-3}$ Torr. By applying 30 W of high frequency power to the substrate heater 15, a plasma is generated on the surface of the substrate heater 15. This plasma treatment is conducted for 30 minutes, and the adsorbed matter on the surface of the substrate 20 is thereby removed to expose a clean surface. Then, by applying 50 W of high frequency power to the target 14, a plasma is generated on the surface of the target 14. During the initial 15 minutes, presputtering is conducted while the shutter 16 is being closed, for the purpose of removing the adsorbed matter on the surface of the target 14 that has been adsorbed during leak at atmospheric pressure. Then with the shutter 16 opened, the formation of the epitaxial Ir film on the surface of the substrate 20 is conducted for 90 minutes. In this case, the film formation rate is 5 nm/min and the film thickness is 450 nm. Table 1 shows the film formation conditions of the epitaxial Ir thin film.

After completion of the film formation, heating is terminated and the substrate 20 is spontaneously cooled for 2 hours or more. Next, formation of an Ir film is also conducted on the edges and the back side of the substrate 20 for 60 minutes. This is for the purpose of ensuring the electrical conduction between the surface of the substrate 20 and a metal substrate holder when direct current discharge is generated in the bias enhanced nucleation and the growth of diamond.

(Bias Enhanced Nucleation Process)

FIG. 3 is a schematic view of the configuration illustrating an embodiment of a parallel plate electrode type direct current plasma generator for applying the bias enhanced nucleation process to a base substrate 20' on which is formed the epitaxial Ir thin film for production of the base substrate for epitaxial diamond film according to the present invention.

Specifically, in the parallel plate electrode type direct current plasma generator 30 shown in FIG. 3, an evacuation system 31 is made up of a rotary pump and a turbo molecular pump, and can attain a vacuum evacuation of the order of $10^{-8}$ Torr. Hydrogen ($H_2$) and methane ($CH_4$) are used as the discharge gases at the time of bias enhanced nucleation, and the configuration is formed in such a way that a mass flow controller 32 can regulate the flow rate. In this case, the flow rates of the discharge gases may be separately regulated. The pressure at the time of preliminary evacuation is measured with an ionization vacuum gauge, and the pressure at the time of bias enhanced nucleation is measured with a Baratron vacuum gauge. In the center of the apparatus, the iridium (Ir) base substrate 20' on a substrate holder 33 and an anode 34 are disposed parallel to each other with a predetermined separation therebetween. The substrate holder 33 is connected to a direct current power source 35 for application of discharge power, and the anode 34 is grounded. A heater 37 connected to an alternating current power source 36, for the purpose of heating the Ir base substrate 20', is disposed beneath the substrate holder 33. For the purpose of initiating discharge, a movable trigger 38 is disposed at a position capable of brought into contact with the substrate holder 33.

The details of the above-described individual members in present Example are as follows.

Anode 34: A molybdenum Mo disc is used.

Substrate holder 33: A Mo disc of 50 mm in diameter and 1 mm in thickness is used and functions as a cathode at the time of discharge; it is important that the Mo disc be sufficiently large in relation to the generated plasma.

Direct current power source 35: This power source includes electronic control mechanisms such as a stabilized power source circuit and has an output power of 1 kW.

Heater 37: Only a Mo heat generator electrically insulated from other members can be supplied with electric current.

Trigger 38: A tungsten (W) wire of 0.5 mm in diameter is used.

The reason for the use of the trigger 38 is that discharge is required to be made to occur at a discharge gas pressure of 100 Torr determined as a bias enhanced nucleation condition, hence the direct current power source 35 in present Example cannot output the discharge initiation voltage in the light of the Paschen's law, and consequently it is necessary to generate sparks to initiate the discharge. In other words, the trigger 38 is used to generate sparks.

Next, the bias enhanced nucleation process according to the present invention is described by using the parallel plate electrode type direct current plasma generator having such a configuration as described above.

The Ir base substrate 20' of 1 inch (2.5 cm) in diameter is placed in the center of the substrate holder 33, the trigger 38 is brought into contact with the substrate holder 33, and thereafter, the interior of a vacuum chamber is evacuated to $1 \times 10^{-6}$ Torr or less. Then, the heater 37 is energized at a current of 52 A and a voltage of 3.0 V to set the substrate temperature at approximately 400° C. Thereafter, the heating was terminated, the substrate is spontaneously cooled, and then $H_2$ and $CH_4$ are introduced to a total pressure of 100 Torr. Additionally, while the discharge gas is being introduced at 500 sccm in total, the pressure is maintained at a constant value by evacuating with a rotary pump. Then, the heating of the substrate is conducted again for 10 minutes. Thereafter, direct current voltage is applied to the substrate holder 33, and the trigger 38 is opened. Sparks initiate the discharge. After the start of the discharge, the heater is controlled by a temperature controller on the basis of the temperature measured with a thermocouple disposed in the substrate holder 33, and thus the substrate temperature at the time of the bias enhanced nucleation is stabilized.

The electrode layout conditions and the bias enhanced nucleation conditions in present Example are described. The electrode layout conditions are presented in Table 2. The anode diameter was varied in a range from 7 to 25 mm, the separation between the anode and the substrate was varied in a range from 5 to 11 mm, and thus, the electrode layout was embodied under twelve different conditions. The bias enhanced nucleation conditions are presented in Table 3. The conditions of the methane concentration of 2%, the discharge gas pressure of 100 Torr and the discharge time of 30 seconds are respectively the conditions under which the epitaxial diamond nucleation is attained on the surface of the Ir base substrate 20'. The discharge current is a constant value of 1000 mA. In this way, the base substrate for epitaxial diamond film according to the present invention can be obtained.

(Epitaxial Diamond Growth Process)

FIG. 4 is a schematic view of the configuration illustrating an embodiment of a multiple electrode type direct current plasma CVD apparatus for conducting the epitaxial diamond growth process, by using the epitaxial Ir base substrate 40 having been subjected to the bias enhanced nucleation process for producing the epitaxial diamond film according to the present invention, namely, by using the base substrate for epitaxial diamond film according to the present invention.

Specifically, in the multiple electrode type direct current plasma CVD apparatus 50 shown in FIG. 4, an evacuation system 51 is made up of a rotary pump and a turbo molecular pump, and can attain a vacuum evacuation of the order of $10^{-8}$ Torr. Hydrogen ($H_2$) and methane ($CH_4$) are used as the discharge gases at the time of epitaxial diamond growth, and the configuration is formed in such a way that a mass flow controller 52 can regulate the flow rate. In this case, the flow rates of the discharge gases may be separately regulated. The pressure at the time of preliminary evacuation is measured with an ionization vacuum gauge, and the pressure at the time of epitaxial diamond growth is measured with a Baratron vacuum gauge. In the center of the apparatus, the Ir base substrate 40 is disposed on two Mo discs 54 placed on a water cooling base 53, and three cathodes 55 are disposed 40 mm above the Ir base substrate 40 discs 54 with 18 mm intervals therebetween. Any one of direct current power sources 56 is connected to each of the cathodes 55. A movable Mo shutter 57 is disposed 2 mm above the Ir base substrate 40, and is switchable between being grounded and being on a floating electric potential.

The details of the direct current power sources 56 and the cathodes 55 are described.

Direct current power sources 56: These power sources each include electronic control mechanisms such as a stabilized power source circuit and the output power of one power source is 3 kW.

Cathodes 55: Each of the cathodes is made up of a tantalum (Ta) rod of 1 mm in diameter and a Ta rod of 5 mm in diameter connected thereto. Each of the cathodes of 1 mm in diameter has a round end and the root of the round end is made smaller in diameter than the round end.

Next, the epitaxial diamond growth process according to the present invention is described by using the multiple electrode type direct current plasma CVD apparatus having such a configuration as described above.

The base substrate 40 for epitaxial diamond film of 1 inch (2.5 cm) in diameter is placed on the center of the Mo disc 54, and thereafter, the interior of a vacuum chamber is evacuated to $1\times10^{-6}$ Torr or less. Then, $H_2$ is introduced to 5 Torr, and then the grounded shutter 57 is rotated toward above the base substrate 40 for epitaxial diamond film. A power is applied to the respective cathodes 55 to initiate discharge between the cathodes 55 and the shutter 57. The discharge current is 300 mA per one cathode 55. $H_2$ is slowly introduced up to 114 Torr, and then the discharge current is slowly increased up to 1000 mA per one cathode 55. Next, $CH_4$ is introduced to set the pressure at 120 Torr. While the discharge gas is being introduced at 500 sccm in total, the pressure is maintained at a constant value by evacuating with a rotary pump. The discharge current is slowly increased up to 1266 mA per one cathode 55. After 10 minutes from the introduction of $CH_4$, the shutter 57 is opened to change the discharge to the discharge between the cathodes 55 and the substrate. On completion of the discharge change, the shutter 57 is switched to the floating potential mode. The time at which the discharge is changed to the discharge between the cathodes 55 and the substrate is taken to correspond to the initiation of the diamond growth. As the substrate temperature, the temperature of the substrate edge is measured by using an optical pyrometer.

For the epitaxial diamond film produced as described above, the surface morphology thereof can be evaluated by using a scanning electron microscope (SEM) and the crystallinity thereof can be evaluated by using X-ray diffraction and Raman spectroscopy.

Examples 1 to 12

The substrate temperature was set at 890° C., and 12 electrode layouts were adopted as shown in Table 4; for each of the 12 electrode layouts, the epitaxial diamond growth was conducted for 3 minutes on the base substrate for epitaxial diamond film having been subjected to the bias enhanced nucleation.

For each of the substrates on which epitaxial diamond growth had been conducted as described above, SEM observation was applied to seven positions located with 3-mm intervals, across the diameter of the substrate, except for both ends of the diameter, and the number density of diamond particles at each position was measured. Consequently, the average value and the variation of each set of measured number density of diamond particles were found as shown in Table 4.

As is clear from Table 4, the average values were varied within a range from $10^7$ to $10^8/cm^2$ and the variations were varied within a range from ±20 to 50%. Accordingly, in these Examples, the conditions for obtaining the most uniform and highest density diamond particles were verified to correspond to the cases where the electrode layout was such that the anode diameter was 15 mm or 20 mm, and the separation between the anode and the substrate was 8 mm.

FIG. 5 shows a Raman spectrum chart, as a result of the evaluation by Raman spectroscopy and X-ray diffraction, wherein the measurement and the evaluation were made on the diamond grown as particles having a particle number density of $10^8/cm^2$ and a variation of ±20% in the case where the electrode layout was such that the anode diameter was 20 mm and the separation between the anode and the substrate was 8 mm. In this measurement, a YAG laser of 532 nm in wavelength was used as the incident light. For each of the measurement positions, a relatively sharp peak was observed at 1332 $cm^{-1}$. From the fact that a sharp peak was observed only at 1332 $cm^{-1}$ in a measurement for a high pressure high temperature synthesized Ib type diamond, the peak at 1332 $cm^{-1}$ was found to be ascribable to diamond.

From above-described Examples, in the production of the epitaxial diamond film of 1 inch (2.5 cm) in diameter, by optimizing, at the time of the bias enhanced nucleation, the substrate temperature and the electrode layout conditions of the parallel plate electrode type direct current plasma generator, diamond particles were successfully grown uniformly and highly densely. Additionally, under such optimized conditions, epitaxial diamond was grown and a 60 μm thick free-standing epitaxial diamond film was obtained in 5 hours.

Accordingly, the bias enhanced nucleation for an Ir base substrate of 1 inch (2.5 cm) or more in diameter is investigated. For the purpose of attaining a further larger area, it is generally accepted that only the current density on the surface of the substrate at the time of the bias enhanced nucleation is fundamentally required to be made constant. The increase of the current density increases the heat amount generated in the substrate, and hence the substrate temperature at the time of the bias enhanced nucleation is required to be regulated.

When the discharge current is increased, the generated heat amount is proportional to the discharge current, the heat capacity of the substrate holder is proportional to the volume thereof, and hence the ratio between the discharge current and the volume of the substrate holder maintained so as to be constant is probably applicable to the large area formation.

Additionally, for the purpose of generating diamond particles uniformly and highly densely, an optimization of the electrode layout conditions is significant. The appropriate anode diameter is anticipated to be approximately 60 to 70% of the diameter of the Ir base substrate. As for the separation between the anode and the substrate, the ratio between the anode diameter and the separation made to be constant is probably applicable to the large area formation, and hence, for example, a prediction up to the diameter of 12 inches (30 cm) is possible as shown in FIG. 6. For the above-described conditions, rough estimations for the respective conditions in relation to the size of the substrate are shown in Table 5. With increasing substrate size, the estimation error is anticipated to increase; however, the cases where the diameter of the Ir base substrate is 12 inches (30 cm) or less can be easily estimated.

As described above, as preferred Examples of the present invention, described are the cases where the epitaxial Ir thin film is formed on a single crystal magnesium oxide (MgO) as the substrate; however, the present invention is not limited to these Examples in such a way that, for example, by using a single crystal sapphire ($\alpha$-Al$_2$O$_3$) as the substrate, and by setting the plane direction thereof to be {0001}, an epitaxial Ir thin film can be formed in the same manner as in above-described Examples. Although as the method for forming the epitaxial Ir thin film, the sputtering method is described above, the vacuum deposition method can also be used. Within the scope not deviating from the spirit of the present invention, various other design modifications may be acceptable.

TABLE 1

Growth conditions of epitaxial Ir film

| Substrate | {100} polished surface of single crystal MgO of 1 inch in diameter × 1 mm |
|---|---|
| Preliminary evacuation pressure [Torr] | $3 \times 10^{-7}$ or less |
| Discharge gas | Ar |
| Discharge gas pressure [Torr] | $1.5 \times 10^{-3}$ |
| Discharge gas flow rate [sccm] | 5 |
| High frequency power [W] | 50 |
| Growth rate [nm/min] | 5 |
| Substrate temperature [° C.] | 680 |
| Growth time [min] | 90 |
| Film thickness [nm] | 50 |

TABLE 2

Electrode layout conditions

| Anode diameter [mm] | 7, 15, 20, 25 |
|---|---|
| Anode-substrate separation [mm] | 5, 8, 11 |

TABLE 3

Bias enhanced nucleation conditions

| Preliminary evacuation pressure [Torr] | $1 \times 10^{-6}$ or less |
|---|---|
| Discharge gas | H$_2$, CH$_4$ |
| Methane concentration [%] | 2 |
| Discharge gas pressure [Torr] | 100 |
| Discharge gas flow rate [sccm] | 500 |
| Discharge current [mA] | 1000 |
| Discharge voltage [V] | 350~460 |
| Substrate temperature [° C.] | 800~1100 |
| Discharge time [sec] | 30~120 |

TABLE 4

Number density distribution of diamond particles

| Anode-substrate separation | Anode diameter | | | |
|---|---|---|---|---|
| | 7 mm | 15 mm | 20 mm | 2 mm |
| 5 mm | $10^8$/cm$^2$ ±40% | $10^8$/cm$^2$ ±30% | $10^8$/cm$^2$ ±40% | $10^8$/cm$^2$ ±50% |
| 8 mm | $10^7$/cm$^2$ ±40% | $10^8$/cm$^2$ ±20% | $10^8$/cm$^2$ ±20% | $10^8$/cm$^2$ ±30% |
| 11 mm | $10^7$/cm$^2$ ±50% | $10^7$/cm$^2$ ±20% | $10^7$/cm$^2$ ±20% | $10^7$/cm$^2$ ±30% |

(Upper row: average value over 7 positions; lower row: variation)

TABLE 5

Relation between Ir base size and bias enhanced nucleation conditions

| | 1 in | 4 in | 8 in | 12 in |
|---|---|---|---|---|
| Substrate diameter [cm] | 1 | 2.5 | 10 | 20 | 30 |
| Substrate area [cm$^2$] | 1 | 5 | 79 | 314 | 707 |
| Discharge current [A] | 0.4 | 1 | 16 | 63 | 141 |
| Substrate holder volume [cm$^3$] | — | 7 | 110 | 440 | 990 |
| Anode diameter [cm] | 0.6 | 1.5~2 | 7 | 14 | 21 |
| Anode-substrate separation [cm] | 0.5 | 0.8 | 2 | 4 | 6 |

EXPLANATION OF SYMBOLS

Figure 1:
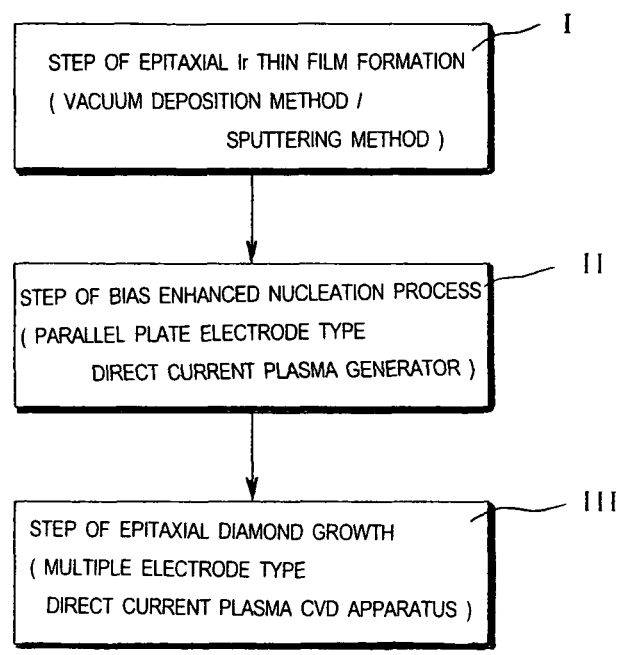
FIG. 1 is a systematic block diagram illustrating a step of producing a base substrate for epitaxial diamond film according to the present invention and steps of producing an epitaxial diamond film according to the present invention produced with the base substrate for epitaxial diamond film.
Figure 2:
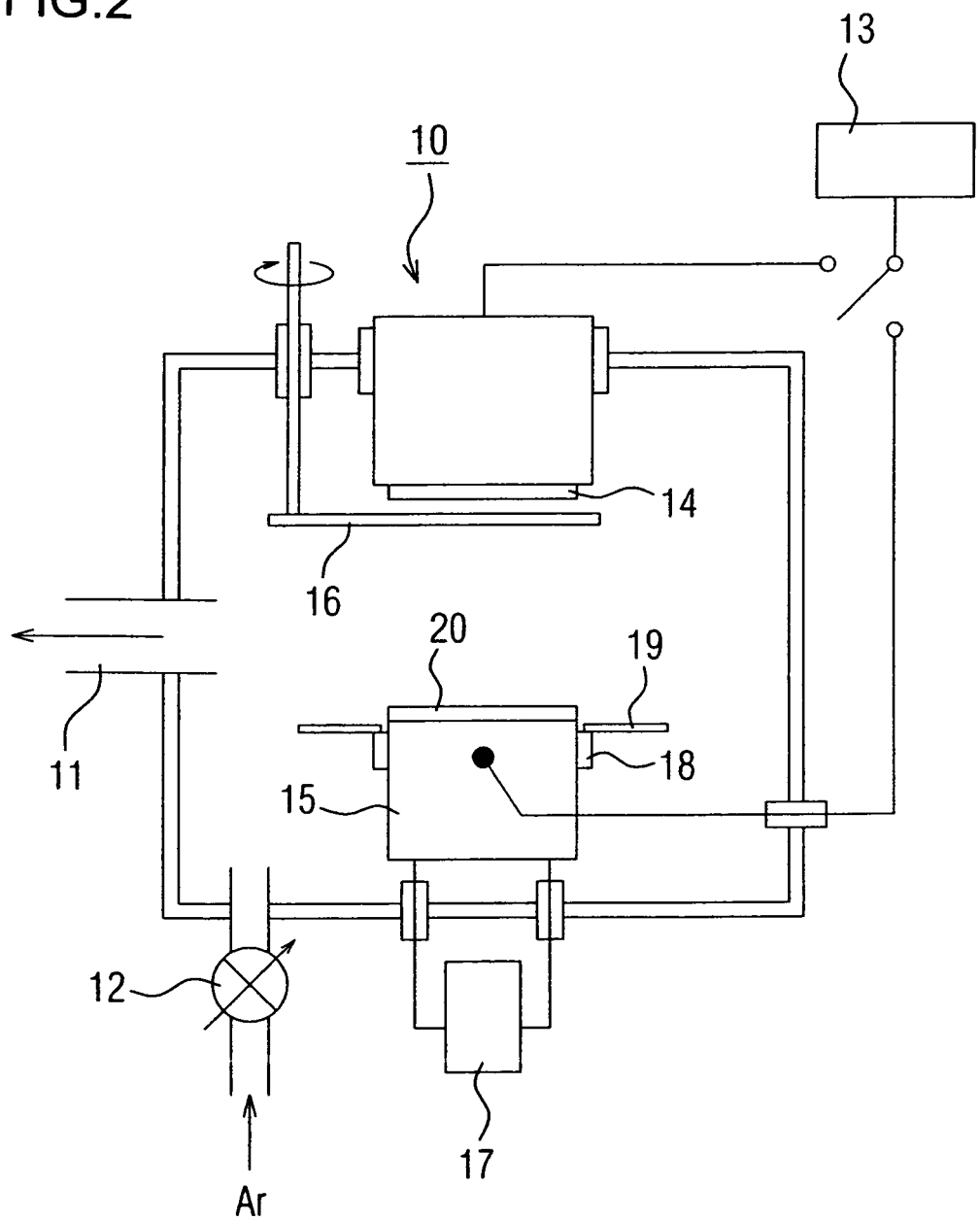
FIG. 2 is a schematic view of the configuration illustrating an embodiment of a high frequency sputtering apparatus for forming an epitaxial Ir base as a film for producing the base substrate for epitaxial diamond film according to the present invention.
Figure 3:
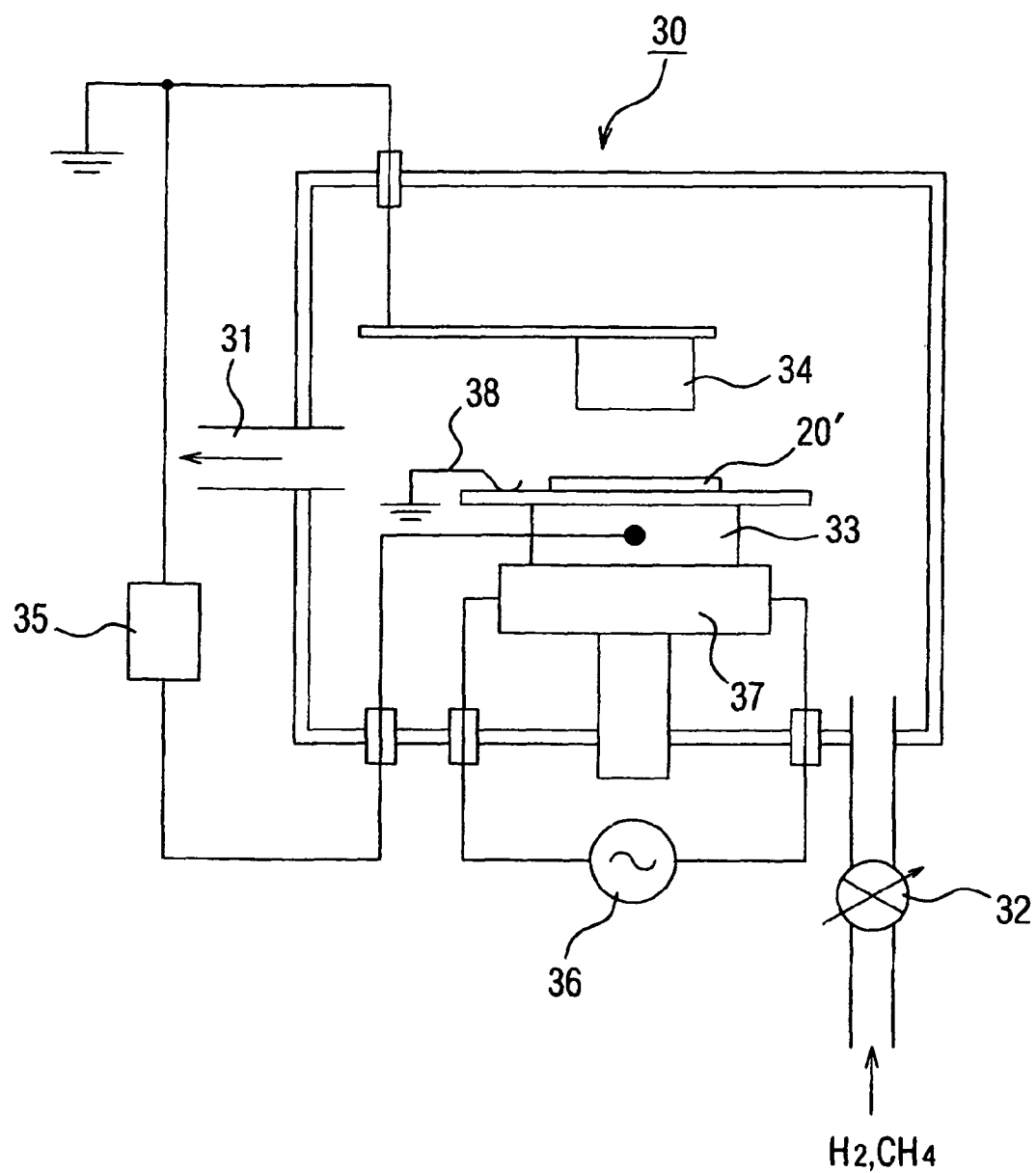
FIG. 3 is a schematic view of the configuration illustrating an embodiment of a parallel plate electrode type direct current plasma generator for producing the base substrate for epitaxial diamond film according to the present invention.
Figure 4:
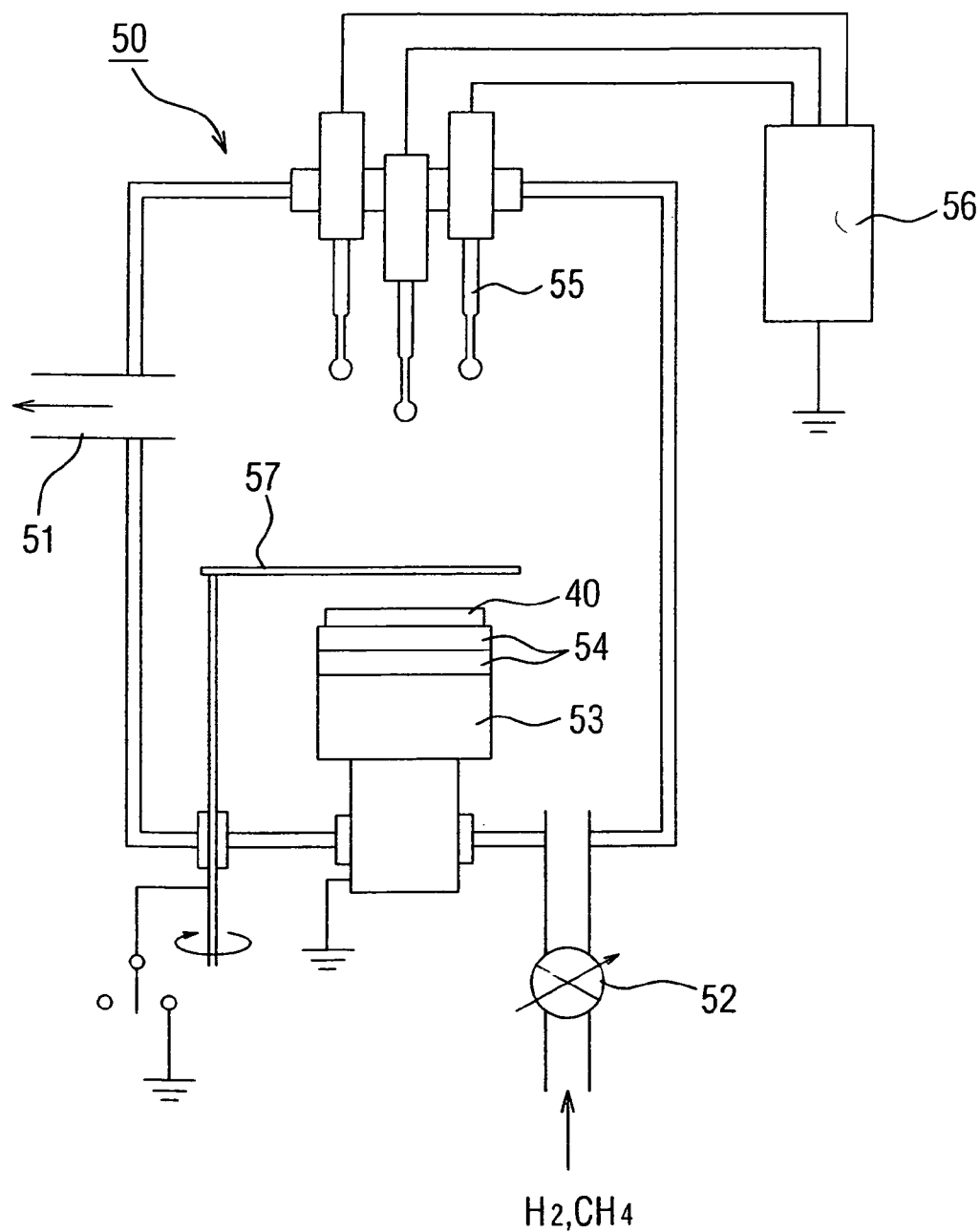
FIG. 4 is a schematic view of the configuration illustrating an embodiment of a multiple electrode type direct current plasma CVD apparatus for producing the epitaxial diamond film according to the present invention.
Figure 5:
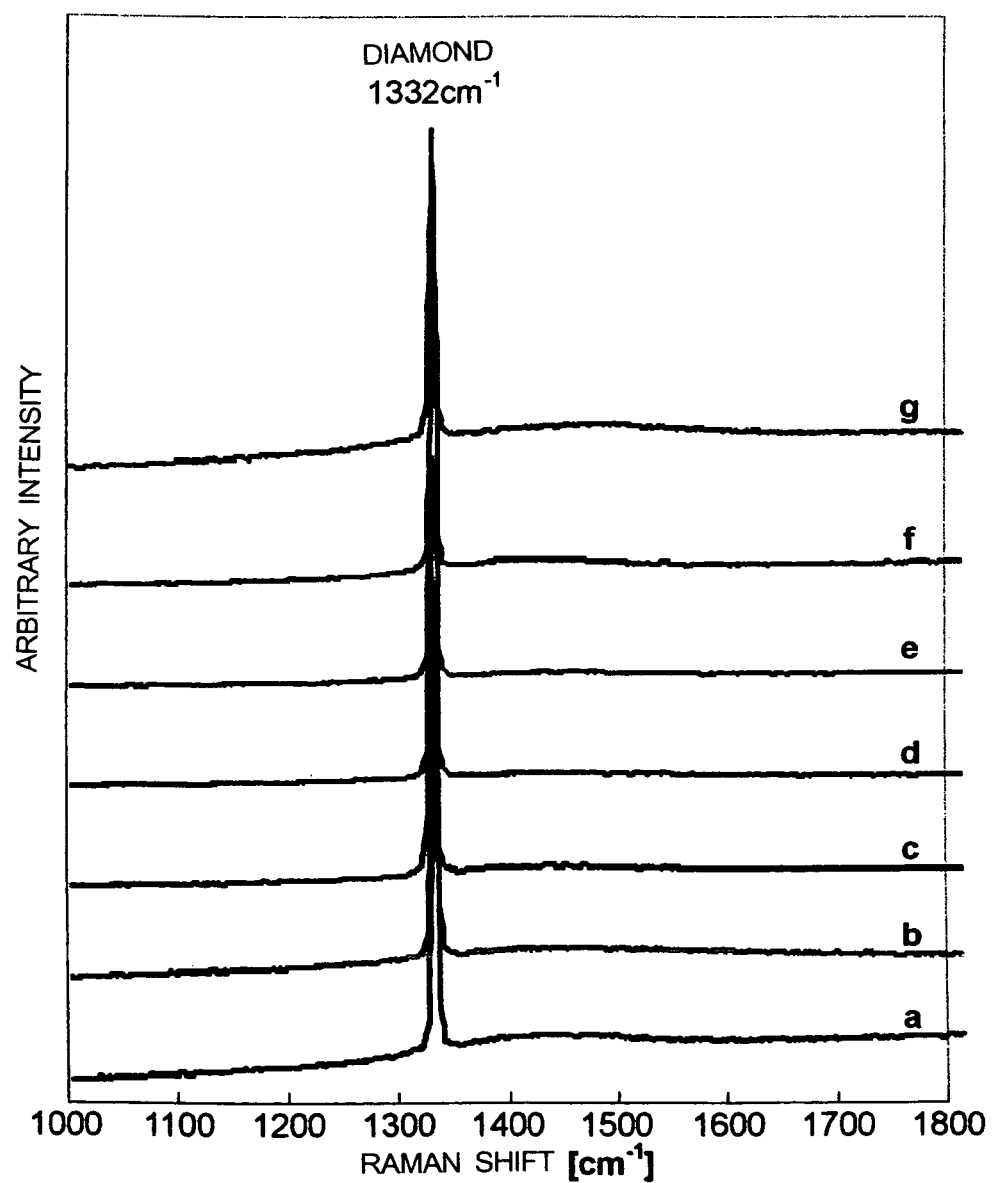
FIG. 5 is a Raman spectra of an epitaxial diamond film produced by the production method according to the present invention, as evaluated by Raman spectroscopy and X-ray diffraction.
Figure 6:
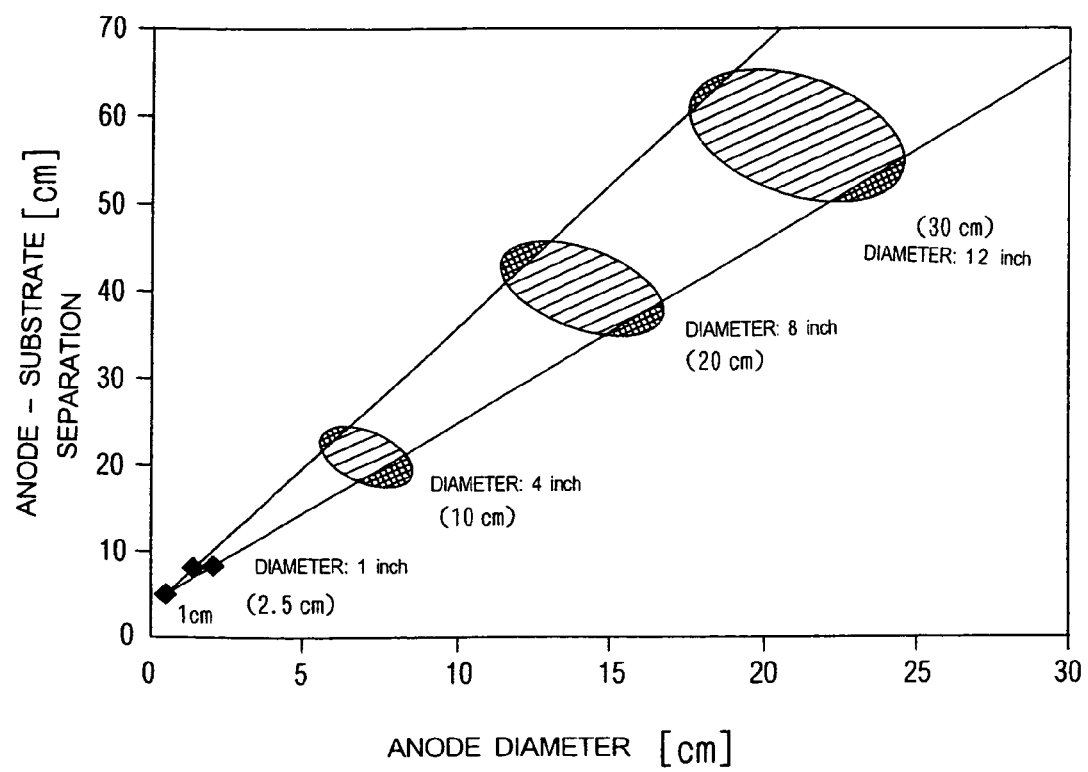
FIG. 6 is a graph illustrating electrode layout conditions for forming a large area of Ir base substrate on which the epitaxial diamond film is assumed to be produced by the production method according to the present invention.

10 High frequency sputtering apparatus
11 Evacuation system
12 Mass flow controller
13 High frequency power source
14 Target
15 Substrate heater
16 Shutter
17 Direct current power source
18 Insulating plate
19 Protecting plate
20 Substrate
20' Ir base substrate
30 Parallel plate electrode type direct current plasma generator
31 Evacuation system
32 Mass flow controller
33 Substrate holder
34 Anode 35 Direct current power source
36 Alternating current power source
37 Heater
38 Movable trigger
40 Ir base substrate subjected to bias enhanced nucleation process (base substrate for epitaxial diamond film)
50 Multiple electrode type direct current plasma CVD apparatus
51 Evacuation system
52 Mass flow controller
53 Water-cooled substrate holder
54 Mo disc
55 Cathode
56 Direct current power source
57 Mo shutter

The invention claimed is:

1. A method for producing a base substrate for epitaxial diamond film, comprising:
   forming an iridium (Ir) base by epitaxial growth of an iridium (Ir) film on a surface of a single crystal magnesium oxide (MgO) substrate; and
   applying to a surface of the iridium (Ir) base a bias enhanced nucleation process for forming epitaxial diamond nuclei by exposing an ion-containing direct current plasma using a parallel plate electrode type direct current plasma generator; and wherein
   said bias enhanced nucleation process is conducted with a direct current plasma using the parallel plate electrode type direct current plasma generator under such conditions that
      a diameter of an anode thereof is set at 7 to 25 mm,
      a separation between the anode and the substrate is set at 5 to 11 mm,
      a discharge gas used is composed of $H_2$ and $CH_4$,
      a concentration of $CH_4$ is set at 2%,
      a discharge gas pressure is set at 100 to 150 Torr,
      a discharge current density is set at 150 to 250 mA/cm$^2$,
      a discharge voltage is set at 250 to 760 V,
      a substrate temperature is set at a temperature from greater than 850° C. to 1100° C., and
      a discharge time is set at 30 to 120 seconds.

2. The method of claim 1, wherein an epitaxial diamond film produced on said substrate has a size of at least 2.5 cm.

3. The method of claim 2, wherein the epitaxial diamond film has a thickness of at least 60 microns.

4. A method for producing an epitaxial diamond film, comprising:
   forming an iridium (Ir) base on a surface of a single crystal magnesium oxide (MgO) substrate by epitaxial growth of an iridium (Ir) film;
   applying to a surface of the iridium (Ir) base a bias enhanced nucleation process for forming epitaxial diamond nuclei by exposing an ion-containing plasma using a parallel plate electrode type direct current plasma generator,
   said bias enhanced nucleation process being conducted with a direct current plasma using the parallel plate electrode type direct current plasma generator under such conditions that
      a diameter of an anode thereof is set at 7 to 25 mm,
      a separation between the anode and the substrate is set at 5 to 11 mm,
      a discharge gas used is composed of $H_2$ and $CH_4$,
      a concentration of $CH_4$ is set at 2%,
      a discharge gas pressure is set at 100 to 150 Torr,
      a discharge current density is set at 150 to 250 mA/cm$^2$,
      a discharge voltage is set at 250 to 760 V,
      a substrate temperature is set at a temperature from greater than 850° C. to 1100° C., and
      a discharge time is set at 30 to 120 seconds; and
   obtaining a free-standing epitaxial diamond film on said substrate by using a multiple electrode type direct current plasma CVD apparatus, said substrate having thereon said base which is formed by said epitaxial growth and on which the epitaxial diamond film is to be formed, and said free-standing epitaxial diamond film being obtained such that a vacuum chamber, which is provided therein with a movable shutter that is disposed above the substrate so as to face cathodes and is switchable between being grounded and being on a floating electric potential, is evacuated to introduce therein a discharge gas $H_2$, and while discharge current of each of the cathodes is being slowly increased up to 1000 mA, a discharge is made between the cathodes and the shutter, and then discharge gas $CH_4$ is introduced into said vacuum chamber to further increase the discharge current at the cathodes, and thereafter the shutter is opened to change the discharge to a discharge that is between the cathodes and the substrate.

5. The method of claim 4, wherein the free-standing epitaxial diamond film has a size of at least 2.5 cm.

6. The method of claim 5, wherein the free-standing epitaxial diamond film has a thickness of at least 60 microns.

7. The method of claim 1, wherein the substrate temperature is set at a temperature from greater than 920° C. to 1100° C.

8. The method of claim 4, wherein the substrate temperature is set at a temperature from greater than 920° C. to 1100° C.

* * * * *